(12) United States Patent
Amanapu et al.

(10) Patent No.: US 10,978,388 B2
(45) Date of Patent: Apr. 13, 2021

(54) SKIP VIA FOR METAL INTERCONNECTS

(71) Applicant: International Business Machines Corporation, Armonk, NY (US)

(72) Inventors: Hari Prasad Amanapu, Guilderland, NY (US); Prasad Bhosale, Albany, NY (US); Nicholas V. LiCausi, Albany, NY (US); Lars W. Liebmann, Saratoga, NY (US); James J. McMahon, Clifton Park, NY (US); Cornelius Brown Peethala, Slingerlands, NY (US); Michael Rizzolo, Albany, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/153,901

(22) Filed: Oct. 8, 2018

(65) Prior Publication Data

US 2020/0111736 A1 Apr. 9, 2020

(51) Int. Cl.
*H01L 21/768* (2006.01)
*H01L 23/522* (2006.01)

(52) U.S. Cl.
CPC ...... *H01L 23/5226* (2013.01); *H01L 21/7685* (2013.01); *H01L 21/76816* (2013.01); *H01L 21/76829* (2013.01); *H01L 21/76843* (2013.01)

(58) Field of Classification Search
CPC ......... H01L 21/76811; H01L 21/76834; H01L 21/7681; H01L 21/76897; H01L 21/7685
See application file for complete search history.

(56) References Cited

U.S. PATENT DOCUMENTS

| | | | |
|---|---|---|---|
| 4,767,724 A | 8/1988 | Kim et al. | |
| 4,840,923 A | 6/1989 | Flagello et al. | |
| 6,143,640 A | 11/2000 | Cronin et al. | |
| 6,430,058 B1 | 8/2002 | Sankman et al. | |
| 7,071,097 B2* | 7/2006 | Colburn | H01L 21/76807 257/758 |
| 9,536,832 B1 | 1/2017 | Leobandung | |
| 9,679,850 B2* | 6/2017 | Chen | H01L 23/53238 |
| 9,818,690 B2* | 11/2017 | Tsai | H01L 21/02071 |
| 10,020,254 B1* | 7/2018 | Bao | H01L 23/53228 |
| 10,157,774 B1* | 12/2018 | Peters | H01L 21/7681 |
| 2006/0014376 A1 | 1/2006 | Agarwala et al. | |

(Continued)

OTHER PUBLICATIONS

Briggs et al., "Supervias bypassing a metallization level at minimum pitch,", Jan. 14, 2016. (IBM internal document not in public domain), 23 pgs.

*Primary Examiner* — Daniel Luke
(74) *Attorney, Agent, or Firm* — Cantor Colburn LLP; Joseph Petrokaitis

(57) ABSTRACT

Semiconductor devices including skip via structures and methods of forming the skip via structure include interconnection between two interconnect levels that are separated by at least one other interconnect level, i.e., skip via to connect Mx and Mx+2 interconnect levels, wherein the intervening metallization level (MX+1) is electrically isolated from the skip via. Cap layers in the metallization levels are pre-patterned to provide openings therein generally corresponding to locations of the skip via structure prior to high aspect ratio etching to form the skip via structure.

7 Claims, 4 Drawing Sheets

(56) References Cited

U.S. PATENT DOCUMENTS

| | | |
|---|---|---|
| 2009/0236143 A1 | 9/2009 | Nakamura |
| 2011/0204482 A1 | 8/2011 | Dirnecker et al. |
| 2012/0175733 A1 | 7/2012 | Kastenmeier et al. |
| 2013/0234336 A1 | 9/2013 | Richter et al. |
| 2013/0334659 A1 | 12/2013 | Liu et al. |
| 2016/0379929 A1 | 12/2016 | Feurprier et al. |
| 2019/0140019 A1 | 5/2019 | Nagel et al. |
| 2020/0058585 A1* | 2/2020 | Xu .................... H01L 21/76877 |

* cited by examiner (PRIOR ART)

SKIP VIA FOR METAL INTERCONNECTS

BACKGROUND

This invention relates generally to interconnect structures for integrated circuits, and more specifically, to fabrication methods and resulting structures for skip vias formed between non-adjacent multilevel metallization layers in a semiconductor wafer.

In fabricating semiconductor devices, multiple electrical connections are typically formed to each device, and millions of devices can be on a substrate. Openings filled with a conductive material are typically formed to connect the device connections to higher device levels for eventual connection to the electrical package contacts. With shrinking device sizes, the pitches between these electrical vias have also been shrinking.

Vias can typically be formed through dielectric layers, for example, interlayer dielectrics, to metallized layers and to components of the actual devices. The electrical connections between devices on the substrate and from the package contacts to the devices can be routed through the different metallized layers, which can act as wiring (e.g., channels). The multiple levels of interconnecting wiring are typically separated by the intervening dielectric layers through which the vias are formed. In typical integrated circuit packages, seven or more metallization levels could be involved. The layout of the electrical connections can therefore be incredibly complex. Multiple patterning techniques involving registered mask patterns can be used to form the different levels. Multiple cycles of masking and etching can be used. This is typically considered the back-end-of-line (BEOL) fabrication stage.

With ever decreasing device dimensions, forming the individual components and electrical contacts becomes more difficult. An approach is therefore needed that retains the positive aspects of traditional field effect transistor (FET) structures, while overcoming the scaling issues created by forming smaller device components and the interconnects.

SUMMARY

Embodiments of the present invention are generally directed to semiconductor devices and methods for forming skip via structures in a semiconductor device. A non-limiting example of forming a skip via structure in a semiconductor device according to one or more aspects of the present invention includes forming a first metallization level (Mx) on a substrate comprising depositing a first interlayer dielectric including one or more semiconductor devices, forming at least one first metal conductor in the first dielectric layer, wherein the at least one metal conductor and the first dielectric have coplanar surfaces, and depositing a first cap layer on the coplanar surfaces. A second metallization level (Mx+1) is formed on the first metallization level (Mx). Forming the second metallization level includes depositing a second interlayer dielectric on the first cap layer and filling the openings in the first cap layer, and forming at least one second metal conductor in the second dielectric layer, wherein the second metal conductor comprises a second cap layer on a top surface thereof and a liner layer that collectively encapsulates the second metal conductor. The second cap layer is patterned to form openings corresponding to the location of the skip via structure. A third interconnect level (Mx+2) is formed on the second metallization level (Mx+1). Forming the third metallization level includes depositing a third interlayer dielectric and filling the openings in the second cap layer with the third interlayer dielectric. A via opening is formed at the location of the skip via structure in the second and third dielectric layers to the first metal conductor. The via opening is filled with a metal conductor, wherein the second metal conductor in the second interconnect level is electrically isolated from the filled via opening extending from the third interconnect level to the first metal conductor of the first interconnect level, and wherein the second and third interlayer dielectrics have substantially the same etch selectivities.

A non-limiting example of a method of forming a skip via structure in a semiconductor device in accordance with one or more aspects of the present invention includes forming a first metallization level (Mx) on a substrate. Forming the first metallization level includes depositing a first interlayer dielectric including one or more semiconductor devices, forming at least one first metal conductor in the first dielectric layer, wherein the at least one first metal conductor and the first dielectric have coplanar surfaces, and depositing a first cap layer on the coplanar surfaces. A second metallization level (Mx+1) is formed on the first metallization level (Mx) and includes depositing a second interlayer dielectric on the first cap layer, forming at least one second metal conductor in the second dielectric layer, forming a sacrificial layer on the second interlayer dielectric, patterning the sacrificial layer, depositing a second cap layer, and removing the sacrificial layer pattern to form openings in the second cap layer corresponding to a location of the skip via structure. A third interconnect level (Mx+2) is formed on the second metallization level (Mx+1). Forming the third metallization level includes depositing a third interlayer dielectric and filling the openings in the second cap layer with the third interlayer dielectric. A skip via opening is formed at the location of the skip via structure in the second and third dielectric layers to the first metal conductor and filled with a metal conductor. The second metal conductor in the second interconnect level is electrically isolated from the metal conductor filled via opening extending from the third interconnect level to the first metal conductor of the first interconnect level. The second and third interlayer dielectrics have substantially the same etch selectivities.

A non-limiting example of the semiconductor device in accordance with one or more other aspects of the present invention includes a first interconnect level (Mx) including a first interlayer dielectric, a first metal conductor, and a first cap layer overlaying the first metal conductor. A second interconnect level (Mx+1) is on the first interconnect layer and includes a second interlayer dielectric, a second metal conductor, and a patterned second cap layer overlaying the second metal conductor including openings therein. A third interconnect level (Mx+2) is on the second interconnect level and includes a third interlayer dielectric, and a third metal conductor. A skip via filled with a metal conductor extends from the third interconnect level (Mx+2) to the first interconnect level (Mx), wherein the openings in the patterned second cap layer have a width dimension greater than a width dimension of the skip via as it transverses the second cap layer, wherein the second metal conductor is electrically isolated from the filled metal via opening.

Additional features and advantages are realized through the techniques of the present invention. Other embodiments and aspects of the invention are described in detail herein and are considered a part of the claimed invention. For a better understanding of the invention with advantages and features, refer to the description and to the drawings.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

Figure 1:
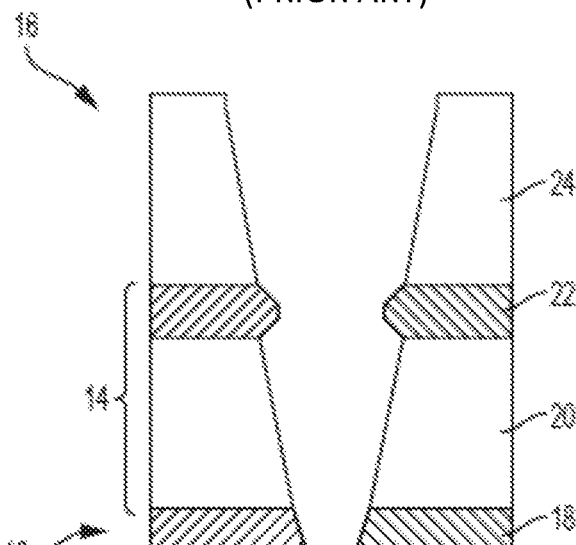
FIG. 1 is a schematic cross-sectional view depicting a semiconductor device including two metallization levels provided in interlevel dielectric layers exhibiting undercutting of the cap layer.

It will be appreciated that for simplicity and clarity of illustration, elements shown in the drawings have not necessarily been drawn to scale. For example, the dimensions of some of the elements could be exaggerated relative to other elements for purpose of clarity.

DETAILED DESCRIPTION

The present invention is generally directed to fabrication methods and resulting structures for skip vias formed between non-adjacent multilevel metallized layers in a semiconductor. The skip vias, also commonly referred to as super vias, provide interconnection between two metallization levels that are separated by at least one other metallization level, i.e., the skip via can be used to connect the Mx and Mx+2 interconnects, wherein a portion of the other metallization level (Mx+1) is in a pathway of the skip via and is electrically isolated therefrom. For example, the skip-via can connect a first metallization layer, M1, to a third metallization layer, M3. As will be described in greater detail herein, the intervening metal interconnect is electrically isolated from the skip via.

One of the problems encountered during skip via formation occurs during the high aspect ratio etching process to form the skip via. High aspect ratio etching can cause undercutting and via width blow out due to changes in the materials as one transitions from one metal level to a non-adjacent metal level. For example, each metallization level generally includes an interlayer dielectric and a capping layer on the interlayer dielectric. The capping materials are generally more resistant to the high aspect ratio etch process than the underlying dielectric, which can result in undercutting of the capping layer. The undercut cap layer deleteriously causes pinch off and void formation during subsequent metallization of the skip via.

FIG. 1 schematically illustrates a cross section of a prior art skip via structure 10 exhibiting a protrusion and via width blowout because of the cap layer. The skip via structure includes an initial metallization level 12, e.g., M(0) (a portion of which is shown), a first metallization level, e.g., (Mx+1), designated by reference numeral 14 and a second metallization level, e.g., (Mx+2), designated by reference numeral 16 (a portion of which is shown). The skip via structure 10 provides a high aspect ratio via running from the second metallization layer 16 to the non-adjacent initial metallization level 12, which underlies the first metallization level 14. Each metallization level generally includes, inter alia, an interlayer dielectric and a cap layer, e.g., the initial metallization level 12 includes interlayer dielectric (not shown) and cap layer 18, the first metallization level 14 includes interlayer dielectric 20 and cap layer 22, and the second metallization level 16 includes interlayer dielectric 24 and cap layer (not shown). Cap layer 22 of the first metallization level 14 is patterned during the high aspect ratio etch process, which because of the increased etch resistance relative to the interlayer dielectric materials results in the formation of a protrusion as shown. The protrusion of the cap layer can result in pinch off and void formation during a subsequent metallization process to fill the skip via structure.

As will be described in greater detail below, in the present invention, the intermediate cap layer and cap layers below (e.g., cap layers 18, 22) are pre-etched to a desired critical dimension prior to the high aspect ratio etch process to form the skip via structure such that there is direct contact of the interlayer dielectric between the different metallization levels at the location of where the skip via structure is formed, thereby providing a constant etch rate of a singular material (i.e., interlayer dielectric) during the high aspect etch process to form the skip via structure. Advantageously, pre-etching the cap layers provides simplification of the etch process for forming the skip via structure for all metallization levels and eliminates undercutting at the cap layer. Optionally, a post dielectric planarization process can be implemented to compensate for any dielectric height variation because of the pre-etch patterning of the cap layers.

Detailed embodiments of the semiconductor structure including the skip via structure and methods for fabricating the semiconductor structure including the skip via structure according to aspects of the present invention will now be described herein. However, it is to be understood that the embodiments of the invention described herein are merely illustrative of the structures that can be embodied in various forms. In addition, each of the examples given in connection with the various embodiments of the invention is intended to be illustrative, and not restrictive. Further, the figures are not necessarily to scale, some features can be exaggerated to show details of particular components. Therefore, specific structural and functional details described herein are not to be interpreted as limiting, but merely as a representative basis for teaching one skilled in the art to variously employ the methods and structures of the present description. For the purposes of the description hereinafter, the terms "upper", "lower", "top", "bottom", "left," and "right," and derivatives thereof shall relate to the described structures, as they are oriented in the drawing figures. The same numbers in the various figures can refer to the same structural component or part thereof.

As used herein, the articles "a" and "an" preceding an element or component are intended to be nonrestrictive regarding the number of instances (i.e. occurrences) of the element or component. Therefore, "a" or "an" should be read to include one or at least one, and the singular word form of the element or component also includes the plural unless the number is obviously meant to be singular.

As used herein, the terms "invention" or "present invention" are non-limiting terms and not intended to refer to any single aspect of the particular invention but encompass all possible aspects as described in the specification and the claims.

Conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

It is to be understood that the various layers and/or regions shown in the accompanying drawings are not drawn to scale, and that one or more layers and/or regions of a type commonly used in complementary metal-oxide semiconductor (CMOS) fabrication techniques, fin field-effect transistor (FinFET) devices, metal-oxide-semiconductor field-effect transistor (MOSFET) devices, and/or other semiconductor fabrication techniques and devices, may or may not be explicitly shown in a given drawing. This does not imply that the layers and/or regions not explicitly shown are omitted from the actual devices. In addition, certain elements could be left out of particular views for the sake of clarity and/or simplicity when explanations are not necessarily focused on the omitted elements. Moreover, the same or similar reference numbers used throughout the drawings are used to denote the same or similar features, elements, or structures, and thus, a detailed explanation of the same or similar features, elements, or structures will not be repeated for each of the drawings.

The semiconductor devices and methods for forming same in accordance with embodiments of the present invention can be employed in applications, hardware, and/or electronic systems. Suitable hardware and systems for implementing embodiments of the invention can include, but are not limited to, personal computers, communication networks, electronic commerce systems, portable communications devices (e.g., cell and smart phones), solid-state media storage devices, functional circuitry, etc. Systems and hardware incorporating the semiconductor devices are contemplated embodiments of the invention. Given the teachings of embodiments of the invention provided herein, one of ordinary skill in the art will be able to contemplate other implementations and applications of embodiments of the invention.

The embodiments of the present invention can be used in connection with semiconductor devices that could require, for example, CMOSs, MOSFETs, and/or FinFETs. By way of non-limiting example, the semiconductor devices can include, but are not limited to CMOS, MOSFET, and FinFET devices, and/or semiconductor devices that use CMOS, MOSFET, and/or FinFET technology.

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

As used herein, the term "about" modifying the quantity of an ingredient, component, or reactant of the invention employed refers to variation in the numerical quantity that can occur, for example, through typical measuring and liquid handling procedures used for making concentrates or solutions. Furthermore, variation can occur from inadvertent error in measuring procedures, differences in the manufacture, source, or purity of the ingredients employed to make the compositions or carry out the methods, and the like. In one aspect, the term "about" means within 10% of the reported numerical value. In another aspect, the term "about" means within 5% of the reported numerical value. Yet, in another aspect, the term "about" means within 10, 9, 8, 7, 6, 5, 4, 3, 2, or 1% of the reported numerical value.

It will also be understood that when an element, such as a layer, region, or substrate is referred to as being "on" or "over" another element, it can be directly on the other element or intervening elements can also be present. In contrast, when an element is referred to as being "directly on" or "directly over" another element, there are no intervening elements present, and the element is in contact with another element.

As used herein, the term "substrate" can include a semiconductor wafer, such as a type IV semiconductor wafer, e.g., silicon wafer, or a type III-V semiconductor wafer, such as a compound semiconductor, e.g., gallium arsenide semiconductor wafer. In one or more embodiments, a number of dielectric layers and semiconductor material layers can be arranged with the substrate to provide microelectronic devices, or smaller devices, which can include semiconductor devices, such as field effect transistors (FETs), fin type field effect transistors (FinFETs), bipolar junction transistors (BJT) and combinations thereof. The at least one device layer can also include memory devices, such as dynamic random access memory (DRAM), embedded dynamic random access memory (EDRAM), flash memory and combinations thereof. The at least one device layer can also include passive devices, such as resistors and capacitors, as well as electrical connections to the devices containing within the at least one device layer.

It should also be noted that not all masking, patterning, and lithography processes are shown, because a person of ordinary skill in the art would recognize where masking and patterning are utilized to form the identified layers and openings, and to perform the identified selective etching processes, as described herein.

Various embodiments of the invention are described herein with reference to the related drawings. Alternative embodiments of the invention can be devised without departing from the scope of this invention. Various connections and positional relationships (e.g., over, below, adjacent, etc.) are set forth between elements in the following description and in the drawings. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. Moreover, the various tasks and process steps described herein can be incorporated into a more comprehensive procedure or process having additional steps or functionality not described in detail herein.

Turning now to an overview of technologies that are more specifically relevant to aspects of the invention, back end of line (BEOL) processes are generally focused on forming metal interconnects between the different devices of the integrated circuit whereas the fabrication of the different devices that make up the integrated circuit are generally done during the front end of line (FEOL) processing.

Exemplary applications/uses to which the present invention can be applied include, but are not limited to: transistors for complementary metal-oxide-semiconductor (CMOS) devices, logic devices (e.g., NAND gates, NOR gates, XOR gates, etc.), memory devices (e.g., DRAM, SRAM, flip-flops, etc.), and complex (e.g., VLSI, ULSI, etc.) application specific integrated circuits (ASICS) and processors.

In various embodiments, the materials and layers can be deposited by physical vapor deposition (PVD), chemical vapor deposition (CVD), atomic layer deposition (ALD), molecular beam epitaxy (MBE), or any of the various modifications thereof, for example, plasma-enhanced chemical vapor deposition (PECVD), metal-organic chemical vapor deposition (MOCVD), low pressure chemical vapor deposition (LPCVD), electron-beam physical vapor deposition (EB-PVD), and plasma-enhanced atomic layer deposition (PEALD). The depositions can be epitaxial processes, and the deposited material can be crystalline. In various embodiments, formation of a layer can be by one or more deposition processes, where, for example, a conformal layer can be formed by a first process (e.g., ALD, PEALD, etc.) and a fill can be formed by a second process (e.g., CVD, electrodeposition, PVD, etc.).

It is to be understood that the present invention will be described in terms of a given illustrative architecture; however, other architectures, structures, substrate materials and process features and steps can be varied within the scope of the present invention.

Referring now to the drawings in which like numerals represent the same or similar elements and to FIGS. 2-5, a semiconductor device 100 including a multi-level metallization scheme with intervening metallization and interlayer dielectric layers is generally shown, in accordance with one or more embodiments of the present invention. Although reference is made to the initial, first, and second interconnect levels, it should be apparent that the terms initial, first, and second are relative and the skip via structures described herein are not intended to be limited to these particular interconnect levels as typical integrated circuit packages can include seven or more metallization levels.

Figure 2:
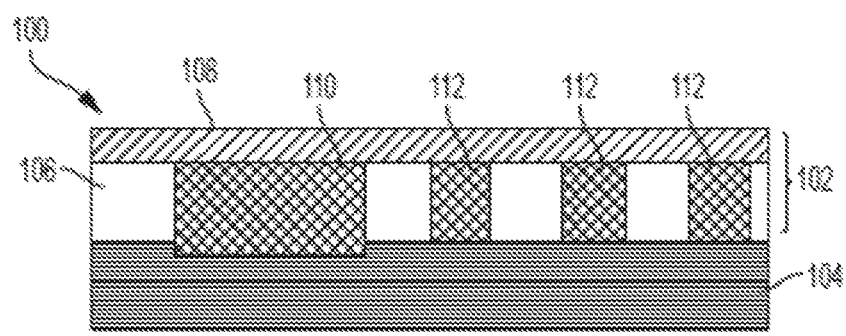
FIG. 2 is schematic cross-sectional view of a semiconductor device including an initial metallization level formed on a substrate in accordance with one or more embodiments of the present invention.

Referring now to FIG. 2, there is shown a semiconductor device 100 including an initial interconnect level 102 (e.g., M0 metallization level). The initial interconnect level 102 is formed on a substrate 104 and includes an interlayer dielectric 106. The interlayer dielectric can be any dielectric material including inorganic dielectrics or organic dielectrics. The dielectric material can be porous or non-porous. Some examples of suitable dielectrics that can be used as the dielectric material include, but are not limited to: $SiO_2$, silsesquioxanes, carbon doped oxides (i.e., organosilicates) that include atoms of Si, C, O and H, thermosetting polyarylene ethers, or multilayers thereof. The term "polyarylene" is used to denote aryl moieties or inertly substituted aryl moieties which are linked together by bonds, fused rings, or inert linking groups such as, for example, oxygen, sulfur, sulfone, sulfoxide, carbonyl and the like. The interlayer dielectric can be deposited by PECVD procedures as is generally known in the art.

Various metal features 110, 112, e.g., lines, vias, passive devices or the like, are lithographically provided in the interlayer dielectric 106. The metal structures can be formed of tungsten, cobalt, copper, alloys thereof, mixtures thereof or the like. A cap layer 108 is formed on the interlayer dielectric layer 106 and the various metal structures 110, 112. The barrier layer can be formed of tantalum (Ta), tantalum nitride (TaN), cobalt (Co), ruthenium (Ru), titanium (Ti), titanium nitride (TiN), tungsten nitride (WN), or combinations thereof. The capping can be formed of silicon nitride (SiN), a silicon oxynitride (SiON), a silicon carbonitride (SiCN), a silicon boronitride (SiBN), a silicon borocarbide (SiBC), a silicon boro carbonitride (SiBCN), a boron carbide (BC), a boron nitride (BN), silicon oxycarbide (SiOC), hydrogenated silicon carbide, silicon dioxide, organosilicate glass, and other low-k dielectrics or combinations thereof. The capping layer 108 can be deposited by PVD, CVD, or ALD processes.

Figure 3:
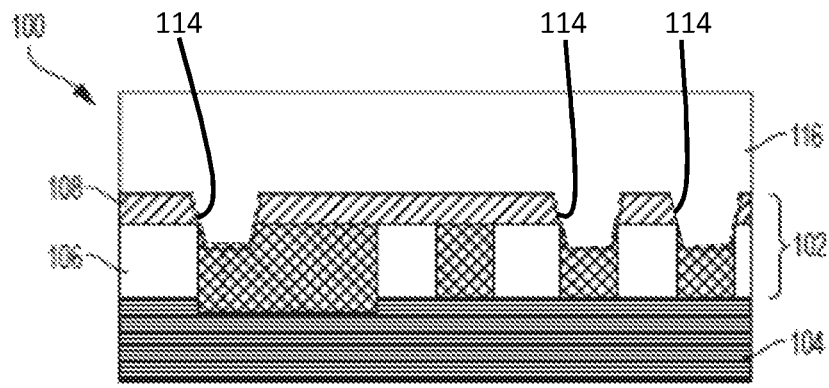
FIG. 3 is a schematic cross-sectional view of the semiconductor device of FIG. 2 subsequent to fabrication of a first metallization level including deposition of a second interlayer dielectric in accordance with one or more embodiments of the present invention.

FIG. 3 depicts the structure 100 of FIG. 2 subsequent to deposition of an interlayer dielectric 116. The interlayer dielectric fills openings 114. The interlayer dielectric can be an ultra-low k dielectric material, which are generally defined as materials exhibiting a dielectric constant less than about 2. Optionally, the interlayer dielectric 116 is subjected to a planarization process to provide a planar top surface. Suitable planarization processes include chemical mechanical polishing (CMP). The CMP process planarizes the surface of the interlayer dielectric by a combination of chemical and mechanical forces using a non-selective slurry composition generally known in the art. The slurry composition contains a silica abrasive material, which removes the different metal layers at substantially the same rate. Alternatively, a planar surface can be formed by a non-selective plasma etching process. The plasma etching process.

Figure 4:
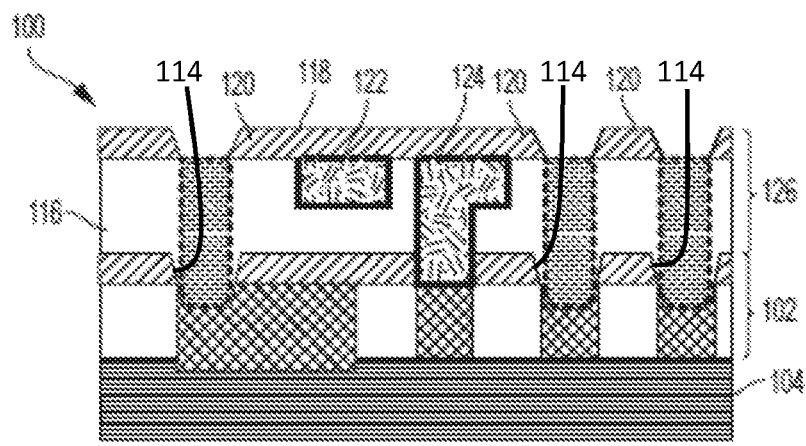
FIG. 4 is a schematic cross-sectional view of the semiconductor device of FIG. 3 subsequent to fabrication of the first metallization level including deposition and patterning of a second cap layer to form openings therein corresponding to the location of the skip via structure in accordance with one or more embodiments of the present invention.

FIG. 4 depicts the structure 100 of FIG. 3 subsequent to deposition and patterning a cap layer 118 to form openings 120. The openings 120 are aligned with the openings 114 and can include a sloped sidewall. Again, the pre-etched openings 114, 120 correspond to the locations of the skip vias (shown in dotted lines), which will be formed later. The interlayer dielectric 116 can include various metal features 122, 124 that are electrically isolated from the later formed skip via. Metal feature 124 includes trench and via features for electrical connection to metal features 112 in the initial metallization level 102. It should be apparent that interlayer dielectric 106, metal features therein 110, 112, and cap layer 108 collectively defines the initial metallization level (M0) 102 whereas interlayer dielectric 116, metal features therein 122, 124, and cap layer 118 collectively can define the first metallization level (MX+1), indicated by reference numeral 126.

Figure 5:
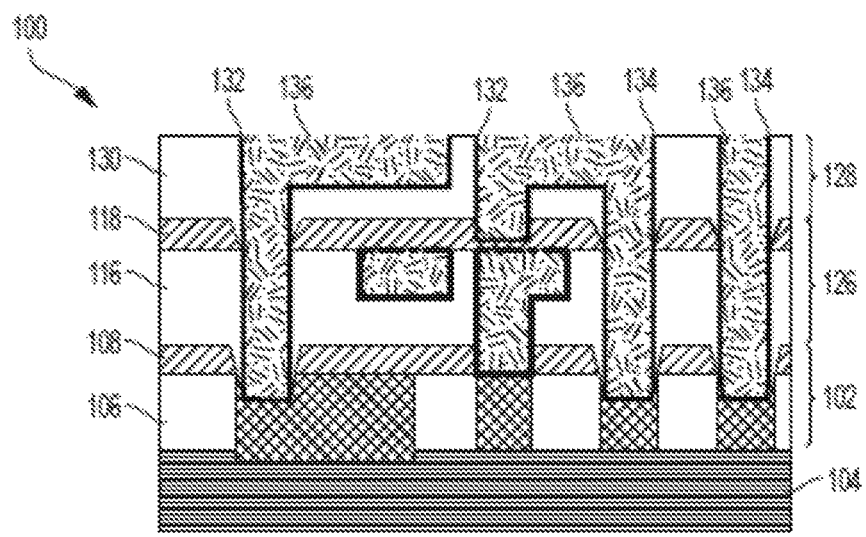
FIG. 5 is a schematic cross sectional view of the semiconductor device of FIG. 4 subsequent to fabrication of a second metallization level including formation of skip via structures to the initial metallization level in accordance with one or more embodiments of the present invention.

FIG. 5 depicts the structure 100 of FIG. 4 subsequent to build up of the second metallization level (MX+2) 128 and formation of the skip via structures. An interlayer dielectric 130 is deposited filling the openings 120. The interlayer dielectric 130 is lithographically patterned and etched to form openings in the interlayer dielectric 130 for various metal features, e.g., trenches 132 as shown. A high aspect ratio etch can then be used to form the skip via openings at locations corresponding to openings 114, 120 in the underlying cap layers 108, 118, which can occur prior to or subsequent to forming the openings defining the openings for metal features 132 within the interlayer dielectric 130. Once the openings for both the metal features and the skip via structures are formed, a metallization process is used to fill the openings. Advantageously, void formation during metallization is eliminated because the cap layers 108, 118 are patterned to form openings for the skip via, thereby eliminating protrusion formation in the cap layer. The high aspect etch process removes interlayer dielectric material providing a constant etch rate from M2 to M0, for example.

Metallization generally includes conformal deposition of a liner layer 134 (i.e., diffusion barrier layer) onto the patterned substrate. The liner layer 134 can include, for example, tantalum, tantalum nitride, cobalt, ruthenium, titanium, titanium nitride, tungsten nitride, and combinations of more than one material (for example tantalum nitride/tantalum or tantalum nitride/cobalt). The presence of the liner layer 134 such as titanium nitride, for example, insures that a subsequently deposited metal such copper, which can participate in interdiffusion during subsequent annealing processes, will not diffuse into interlayer dielectric. The liner layer 134 can be deposited by PVD, CVD, or ALD processes.

Next, an optional conformal seed layer (not shown) is deposited. The function of the seed layer is to provide a base upon which a metal conductor can be deposited. The seed layer can be formed by one or more methods known to those skilled in the art. For example, the seed layer can be formed by chemical vapor deposition (CVD), physical vapor deposition (PVD), or some variation of these two deposition processes. The seed layer can also be formed electrochemically or by an electroless process. In the case of PVD, the seed layer can be deposited by reactive or non-reactive sputtering from a single alloy target, or from multiple targets, by ionized sputtering.

The composition of the one or metals in the deposited seed layer is typically from 1 atomic percent to about 10 atomic percent. In some embodiments, the deposited seed layer will contain from about 1 atomic percent to about 7 atomic percent. Examples of seed layers are copper, copper manganese, and the like.

Following deposition of the seed layer, a layer of metal is then deposited. The metal can be copper, but can be any suitable conductor including, but not limited to Cu, Co, Al, AlCu, Ti, TiN, Ta, TaN, W, WN, MoN, Pt, Pd, Os, Ru, $IrO_2$, $ReO_2$, $ReO_3$, alloys thereof, and mixtures thereof. In some structures, the copper metal layer can be used and can include an alloying element such as C, N, O, Cl or S, which have been shown to improve the reliability of the copper conductor. The amount of alloying element in the copper alloy is typically in the range of about 0.001 weight percent (wt. %) to about 10 wt %).

The metal layer can be formed by CVD, sputtering, electrochemical deposition or like processes. For example, the deposition of copper can proceed by electrochemical deposition such as electroplating or electroless plating.

Following formation of the metal layer, the substrate is subjected to a planarization process to remove any metal overburden (includes seed layer and liner layer removal) such that a top surface of the metal is substantially coplanar to the low k dielectric layer as shown. For example, the surface can be planarized using an electropolishing process. In an electropolishing process, small amounts of metal are etched by electroetch or electrochemical etching to provide a metal interconnect having a top metal surface generally coplanar to the top surface of the dielectric. Such a structure is often referred to as a recessed structure. In another embodiment, the planar surface is formed by chemical mechanical polishing (CMP). The CMP process planarizes the surface of the interconnect structure by a combination of chemical and mechanical forces using a non-selective slurry composition generally known in the art. The slurry composition contains a silica abrasive material, which removes the different metal layers at substantially the same rate. Alternatively, a planar surface can be formed by a non-selective plasma etching process. The plasma etching process can include additional planarizing layers deposited onto metal layer. For example, a layer of photoresist can be deposited onto metal layer prior to performing the non-selective etch process.

In this manner, a metal conductor 136 is formed in the openings to provide electrical connection from the second interconnect level 128 to the initial interconnect level 102 while electrically isolating the first interconnect level 126.

Figure 6:
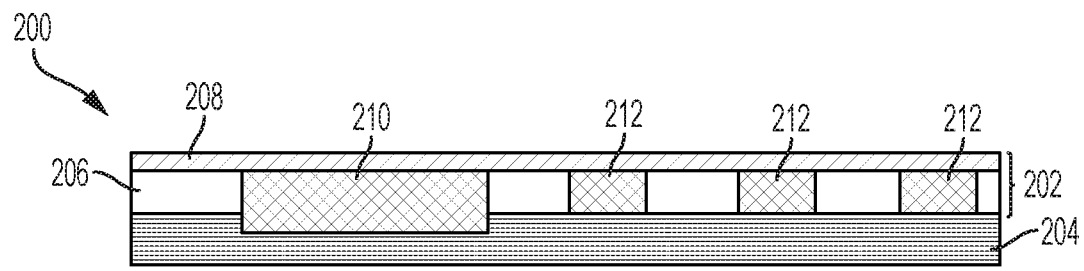
FIG. 6 is schematic cross-sectional view of a semiconductor device including an initial metallization level formed on a substrate in accordance with one or more embodiments of the present invention in accordance with one or more embodiments of the present invention.

Referring now to FIGS. 6-11, there is schematically illustrated a process flow for forming a semiconductor device including a skip via structure in accordance with one or more other embodiments. As shown in FIG. 6, the semiconductor device 200 includes an initial interconnect level 202 (i.e., M0) formed on a substrate 204. The initial metallization level includes an interlayer dielectric 206 including various metal features 210, 212, e.g., lines, vias or the like. A cap layer 208 is provided on the interlayer dielectric 206.

Figure 7:
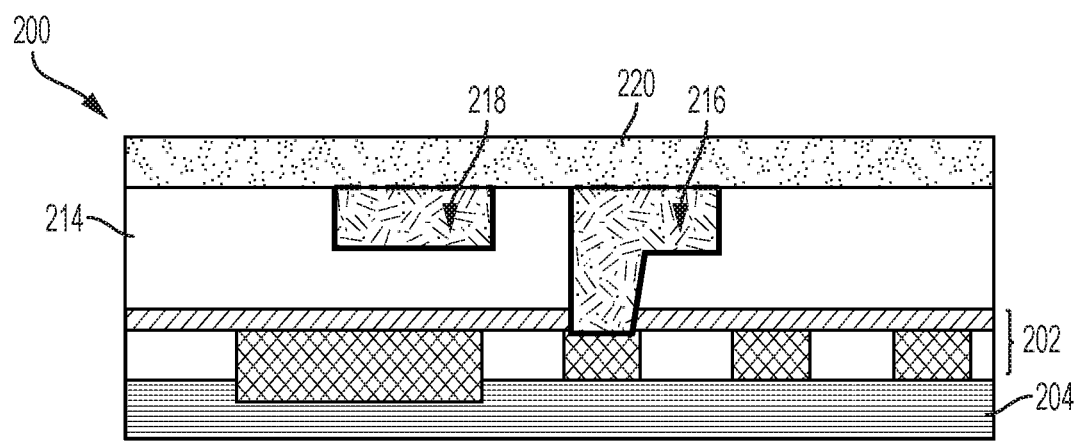
FIG. 7 is a schematic cross sectional view of the semiconductor device of FIG. 6 subsequent to deposition of a second interlayer dielectric and a sacrificial layer thereon in accordance with one or more embodiments of the present invention.

FIG. 7 schematically illustrates the semiconductor structure 200 of FIG. 6 subsequent to deposition of an interlayer dielectric 214 onto the initial metallization level 202. The interlayer dielectric 214 can be patterned to include one or more metal features 216, 218 as shown. Metal feature 216 includes a trench/via for electrical connection to one of the metal features in the initial metallization level 202. A sacrificial layer 220 is deposited onto the interlayer dielectric 214. The sacrificial layer is not intended to be limited to any particular material and can be formed of a material having an etch selectivity different from the underlying interlayer dielectric 214.

Figure 8:
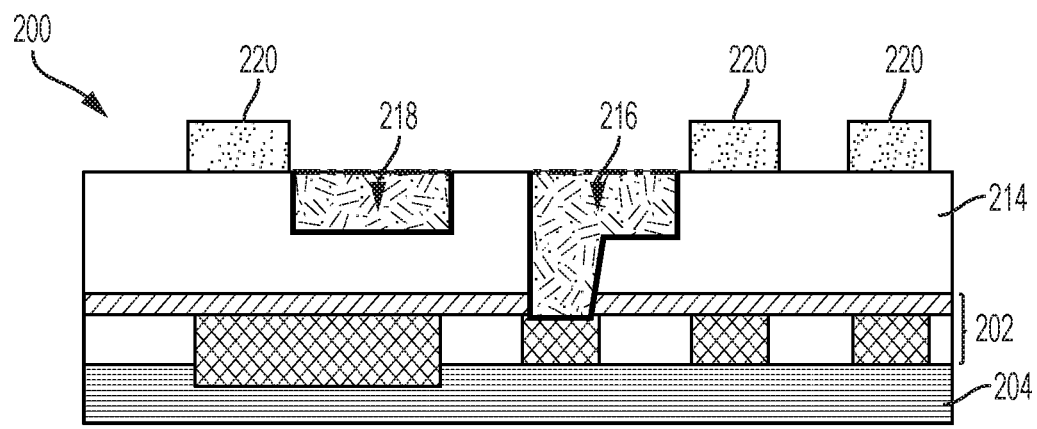
FIG. 8 is a schematic cross sectional view of the bottom electrode structure of FIG. 7 subsequent to patterning of the sacrificial dielectric in accordance with one or more embodiments of the present invention.

FIG. 8 schematically illustrates the semiconductor structure 200 of FIG. 7 subsequent to lithographic patterning and etching of the sacrificial layer 220. The remaining portions of the sacrificial layer 220 generally correspond to locations where the skip vias are to be located.

Figure 9:
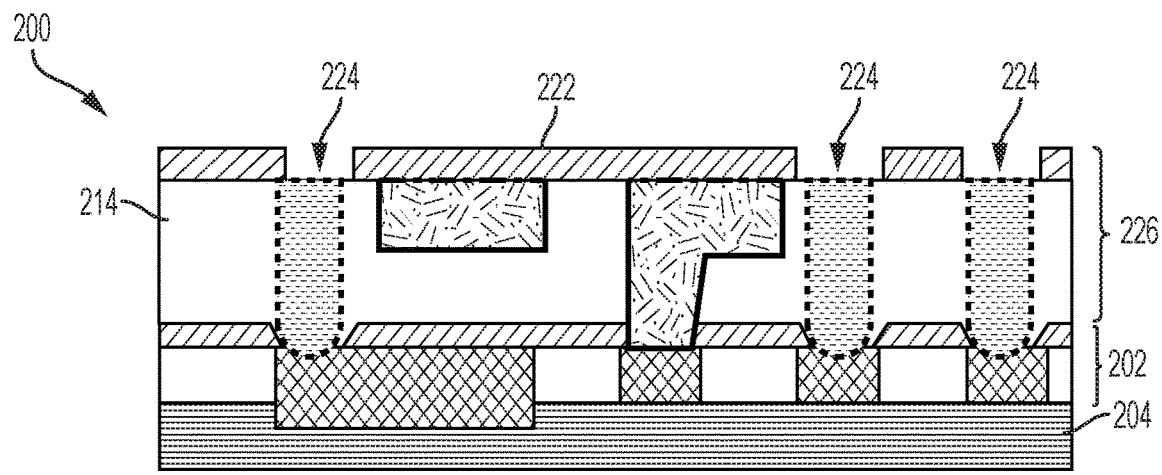
FIG. 9 is a schematic cross sectional view of the semiconductor device of FIG. 8 subsequent to deposition of a second cap layer and removal of the patterned sacrificial layer to form openings therein at a location of the skip via structure in accordance with one or more embodiments of the present invention.

FIG. 9 schematically illustrates the semiconductor structure 200 of FIG. 8 subsequent to deposition of a cap layer 222 onto the substrate 204 followed by selective removal of the sacrificial layer to form openings 224. The interlayer dielectric 214 and the cap layer 222 generally define the first metallization level 226.

Figure 10:
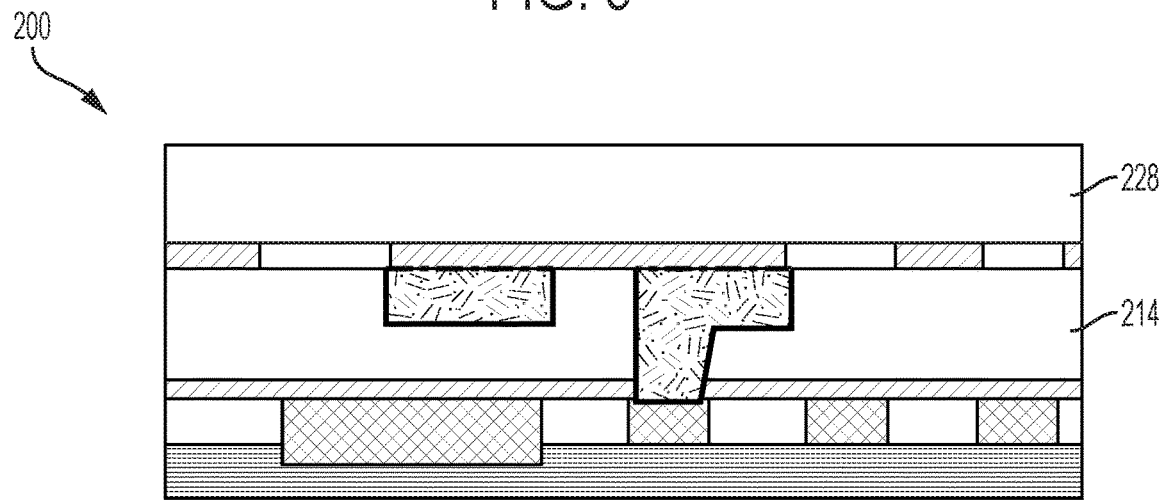
FIG. 10 is a schematic cross sectional view of the semiconductor device of FIG. 9 subsequent to deposition of a third interlayer dielectric in accordance with one or more embodiments of the present invention.

FIG. 10 schematically illustrates the semiconductor structure 200 of FIG. 9 subsequent to deposition of an interlayer dielectric 228 onto the substrate filling openings 224. As previously described, the interlayer dielectric 228 can be subjected to a planarization process to compensate for any thickness variation during deposition of the interlayer dielectric 228 because of the presence of the openings 224 or thickness variations resulting from the interlayer dielectric deposition process. The interlayer dielectric 228 can be provided as the same or different material than the materials of the underlying interlayer dielectrics but should have the substantially the same etch selectivity.

Figure 11:
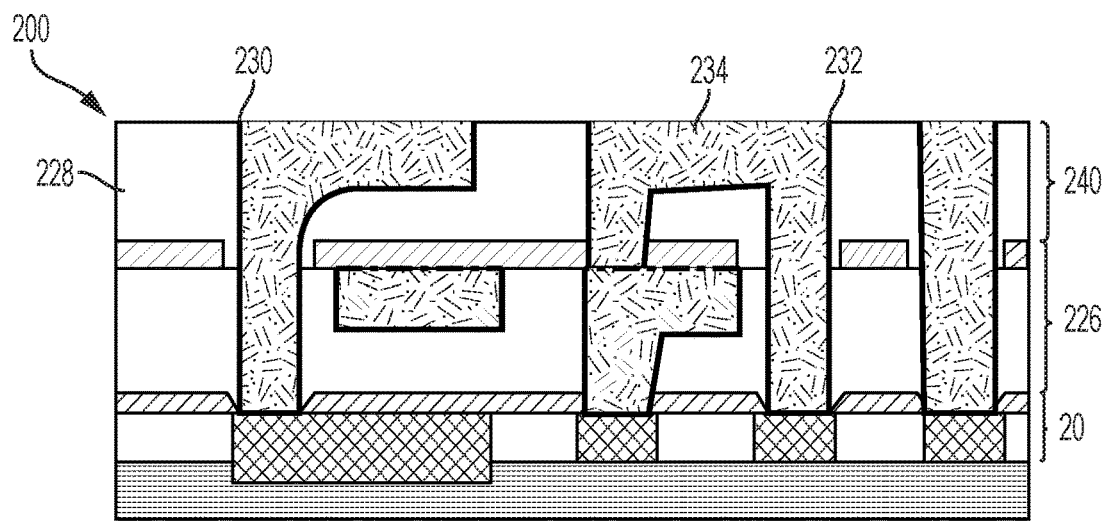
FIG. 11 is a schematic cross sectional view of a skip via structure in accordance with one or more embodiments of the invention.

FIG. 11 schematically illustrates the semiconductor structure 200 of FIG. 11 subsequent to formation of openings including a high aspect ratio etch process to form the openings 230 for the skip vias and other metal features. After formation of the openings, a metallization process such as described above is used to fill the openings. The metallization process includes conformal deposition of a liner layer 232 prior to filling the opening with a bulk metal conductor 234 such that the liner layer 232 collectively encapsulates the bulk metal conductor 234. The interlayer dielectric 228 and cap layer (not shown) generally define the second metallization level 240. As a result, the skip vias provides an electrical connection between the second metallization level 240 and the initial metallization level 202, thereby skipping the first metallization level.

While the present invention has been particularly shown and described with respect to preferred embodiments, it will be understood by those skilled in the art that the foregoing and other changes in forms and details can be made without departing from the spirit and scope of the invention. It is therefore intended that the present invention not be limited to the exact forms and details described and illustrated but fall within the scope of the appended claims.

What is claimed is:

1. A method of forming a skip via structure in a semiconductor device, the method comprising:

forming a first metallization level (Mx) on a substrate comprising one or more semiconductor devices, the forming comprising depositing a first interlayer dielectric, forming at least one first metal conductor in the first dielectric layer, wherein the at least one metal conductor and the first dielectric have coplanar surfaces, and depositing a first cap layer on the coplanar surfaces;

forming a second metallization level (Mx+1) on the first metallization level (Mx) comprising depositing a second interlayer dielectric on the first cap layer and filling openings in the first cap layer, and forming at least one second metal conductor in the second dielectric layer;

patterning a second cap layer on a top surface of the second metal conductor to form openings corresponding to the location of the skip via structure;

providing a liner layer to collectively encapsulate the second metal conductor;

forming a third interconnect level (Mx+2) on the second metallization level (Mx+1) comprising depositing a third interlayer dielectric and filling the openings in the second cap layer with the third interlayer dielectric;

forming a via opening at the location of the skip via structure in the second and third dielectric layers to the first metal conductor; and filling the via opening with a metal conductor, wherein the second metal conductor in the second interconnect level is electrically isolated from the filled via opening extending from the third interconnect level to the first metal conductor of the first interconnect level, and wherein the second and third interlayer dielectrics have substantially the same etch selectivities.

2. The method of claim 1, wherein the first, second and third interlayer dielectrics comprise different materials.

3. The method of claim 1, wherein filling the via opening with the metal conductor comprises depositing a barrier layer on the sidewalls defining the via opening prior to filling the via opening with the metal conductor.

4. The method of claim 1, wherein at least one or more of the first, second and third interlayer dielectric comprises $SiO_2$, silsesquioxanes, carbon doped oxides that include atoms of Si, C, O and H, thermosetting polyarylene ethers, or multilayers thereof.

5. The method of claim 3, wherein the barrier layer comprises tantalum, tantalum nitride, cobalt, ruthenium, titanium, titanium nitride, tungsten nitride, or combinations thereof.

6. The method of claim 1, wherein the first and second cap layers comprise silicon nitride, a silicon oxynitride, a silicon carbonitride, a silicon boronitride, a silicon borocarbide, a silicon borocarbonitride, a boron carbide, a boron nitride, silicon oxycarbide, hydrogenated silicon carbide, silicon dioxide, organosilicate glass, or combinations thereof.

7. The method of claim 1 further comprising planarizing the first and second interlayer dielectrics prior to depositing the first and second cap layer, respectively, to provide planar top surfaces.

* * * * *